(12) United States Patent
Muthali (10) Patent No.: US 8,742,807 B1
(45) Date of Patent: Jun. 3, 2014

(54) LOW SUPPLY VOLTAGE ANALOG PHASE INTERPOLATOR

(75) Inventor: Harish S. Muthali, San Jose, CA (US)

(73) Assignee: Ambarella, Inc., Santa Clara, CA (US)

( * ) Notice: Subject to any disclaimer, the term of this patent is extended or adjusted under 35 U.S.C. 154(b) by 0 days.

(21) Appl. No.: 13/479,576

(22) Filed: May 24, 2012

(51) Int. Cl.
*H03L 7/06* (2006.01)
(52) U.S. Cl.
USPC ............ 327/155; 327/146; 327/152; 327/162
(58) Field of Classification Search
USPC ........ 327/41, 144–163, 141; 331/1 A, 15–17; 375/373–376
See application file for complete search history.

(56) References Cited

U.S. PATENT DOCUMENTS

| | | | | |
|---|---|---|---|---|
| 5,485,490 | A * | 1/1996 | Leung et al. .................. | 375/371 |
| 5,614,855 | A * | 3/1997 | Lee et al. ...................... | 327/158 |
| 7,184,509 | B2 * | 2/2007 | Cho et al. ...................... | 375/373 |
| 7,777,576 | B2 * | 8/2010 | Waheed et al. ................ | 331/17 |
| 7,825,710 | B2 * | 11/2010 | Kim et al. ..................... | 327/158 |
| 7,912,167 | B2 * | 3/2011 | Saeki ............................. | 375/355 |
| 7,915,941 | B1 | 3/2011 | Pan et al. ...................... | 327/231 |
| 8,004,328 | B2 * | 8/2011 | Kim et al. ..................... | 327/158 |
| 8,116,418 | B2 * | 2/2012 | Chien ............................ | 375/373 |
| 8,363,773 | B2 * | 1/2013 | Chien ............................ | 375/371 |
| 2006/0238227 | A1 * | 10/2006 | Kim et al. ..................... | 327/158 |
| 2007/0177700 | A1 * | 8/2007 | Saeki ............................. | 375/371 |

OTHER PUBLICATIONS

Maneatis, John G., "Low-Jitter Process-Independent DLL and PLL Based on Self-Biased Techniques", IEEE Journal of Solid-State Circuits, Vo. 31, No. 11, Nov. 1996, pp. 1723-1732.
Bulzacchelli, John F., et al., "A 10-Gb/s 5-Tap DFE/4-Tap FFE Transceiver in 90-nm CMOS Technology", IEEE Journal of Solid-State Circuits, vol. 41, No. 12, Dec. 2006, pp. 2885-2898.

* cited by examiner

*Primary Examiner* — Brandon S Cole
(74) *Attorney, Agent, or Firm* — Christopher P. Maiorana, PC (57) ABSTRACT

An apparatus comprising a first phase circuit, a second phase circuit, and a current steering circuit. The first phase circuit may be configured to generate a first portion of a phase interpolated clock signal in response to (i) a control signal, (ii) a first bias signal, and (iii) a feedback of said phase interpolated clock signal. The second phase circuit may be configured to generate a second portion of the phase interpolated clock signal in response to (i) the control signal, (ii) a second bias signal, and (iii) the feedback of the phase interpolated clock signal. The current steering circuit may be configured to generate the first bias signal and the second bias signal in response to a reference bias signal.

11 Claims, 11 Drawing Sheets

LOW SUPPLY VOLTAGE ANALOG PHASE INTERPOLATOR

FIELD OF THE INVENTION

The present invention relates to clock data recovery circuits generally and, more particularly, to a method and/or apparatus for implementing a low supply voltage analog phase interpolator.

BACKGROUND OF THE INVENTION

Conventional clock data recovery circuits detect random serial data. A loop uses a phase detector to compare the phase of the incoming data with an internal clock (or an output of a phase interpolator). The phase detector generates UP/DN signals to control the inputs to the phase interpolator so that the output of the phase interpolator aligns with the phase of the incoming serial data.

It would be desirable to implement a low supply voltage analog phase interpolator.

SUMMARY OF THE INVENTION

The present invention concerns an apparatus comprising a first phase circuit, a second phase circuit, and a current steering circuit. The first phase circuit may be configured to generate a first portion of a phase interpolated clock signal in response to (i) a control signal, (ii) a first bias signal, and (iii) a feedback of the phase interpolated clock signal. The second phase circuit may be configured to generate a second portion of the phase interpolated clock signal in response to (i) the control signal, (ii) a second bias signal, and (iii) the feedback of the phase interpolated clock signal. The current steering circuit may be configured to generate the first bias signal and the second bias signal in response to a reference bias signal.

The objects, features and advantages of the present invention include providing an analog phase interpolator that may (i) operate using a low voltage supply, (ii) respond to a digital control signal, (iii) operates in a clock data recovery (CDR) circuit, (iv) operate using an analog phase interpolator, and/or (v) meet various headroom specifications.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
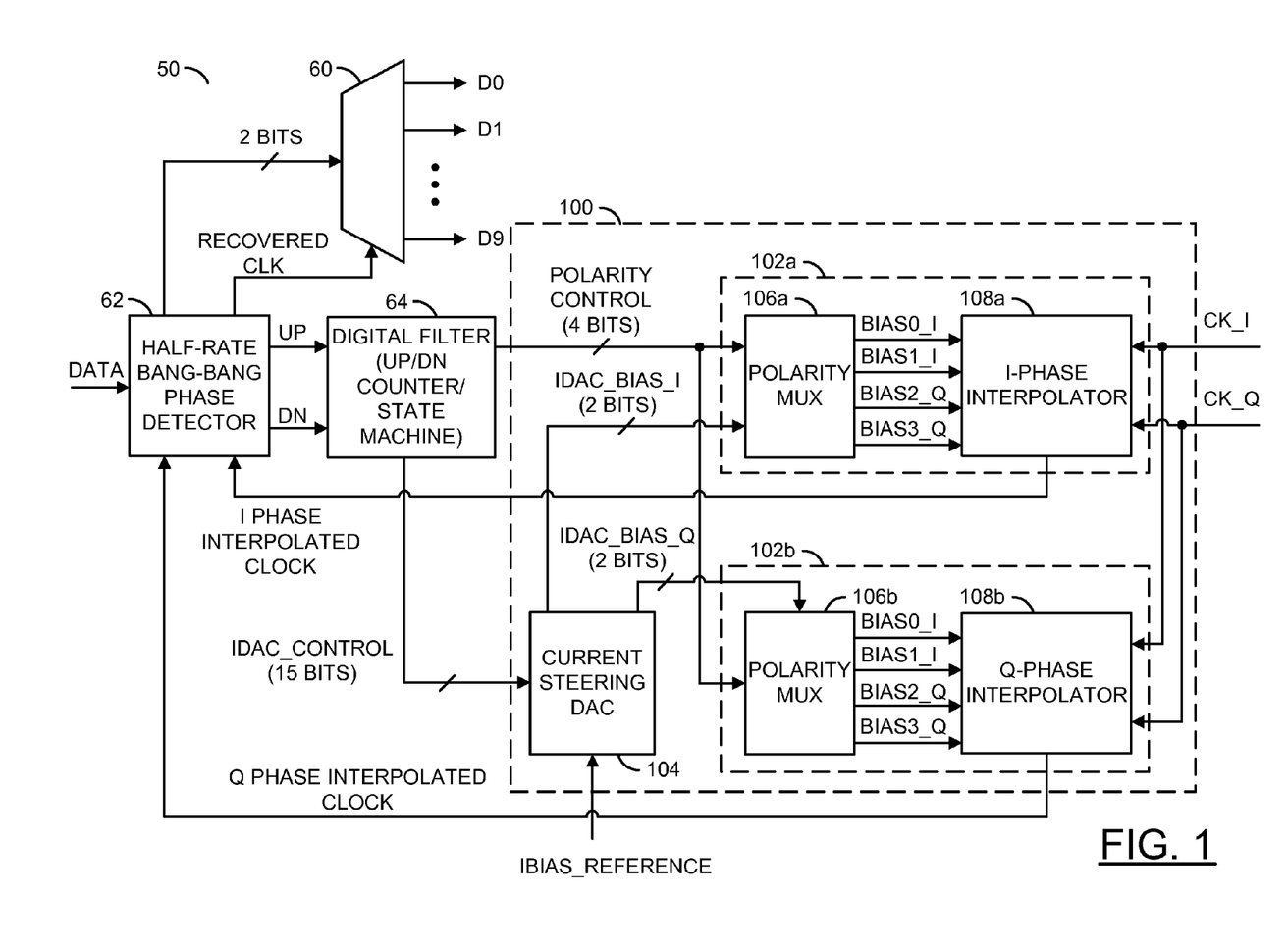
FIG. 1 is a block diagram illustrating a context of the present invention.

Referring to FIG. 1, a block diagram of an apparatus 50 illustrating a context of the present invention is shown. The apparatus 50 illustrates a clock data recovery (CDR) loop using a phase interpolator circuit. The apparatus 50 generally comprises a block (or circuit) 60, a block (or circuit) 62, a block (or circuit) 64, and a block (or circuit) 100. The circuit 60 may be implemented as an output circuit. The circuit 60 may generate a number of recovered data signals (e.g., D0-D9). The circuit 62 may be implemented as a phase detector circuit. In one example, the circuit 62 may be implemented as a half-rate bang-bang phase detector. The circuit 62 may receive a signal (e.g., DATA). The signal DATA may be random serial data. The circuit 64 may be implemented as a digital filter circuit. In one example, the circuit 64 may include an up/down counter and a state machine. The circuit 100 may be implemented as an interpolator block (or circuit).

The circuit 100 generally comprises a block (or circuit) 102a, a block (or circuit) 102b, and a block (or circuit) 104. The circuit 102a may be implemented as a first phase interpolator block. The second circuit 102b may be implemented as a second phase interpolator block. The circuit 104 may be implemented as a current steering digital-to-analog converter (DAC) circuit. The circuit 104 may receive a signal (e.g., IDAC_CONTROL) and a signal (e.g., IBIAS_REFERENCE). The signal IDAC_CONTROL may be implemented, in one example, as a 15-bit control signal. However, the particular number of bits may be varied to meet the design criteria of a particular implementation. The circuit 104 may generate a signal (e.g., IDAC_BIAS_Q) and a signal (e.g., IDAC_BIAS_I). In general, the circuit 102a and/or the circuit 102b are implemented as analog circuits. The circuit 104 generally converts the digital signal IDAC_CONTROL from a digital control signal to an analog signal used by the circuits 102a and/or 102b.

The circuit 102a generally comprises a block (or circuit) 106a and a block (or circuit) 108a. Similarly, the circuit 102b may be implemented as a block (or circuit) 106b and a block (or circuit) 108b. The circuit 106a and the circuit 106b may each be implemented as a respective polarity multiplexer. The circuit 108a may be implemented as an I-phase interpolator. The circuit 108b may be implemented as a Q-phase interpolator. In general, the circuit 106a and the circuit 106b may have a similar implementation. In general, the circuit 108a and the circuit 108b may have a similar implementation. The circuit 106a may receive the signal IDAC_BIAS_I. The circuit 106b may receive the signal IDAC_BIAS_Q. The signals IDAC_BIAS_I and IDAC_BIAS_Q may be implemented as 2-bit signals.

Figure 2:
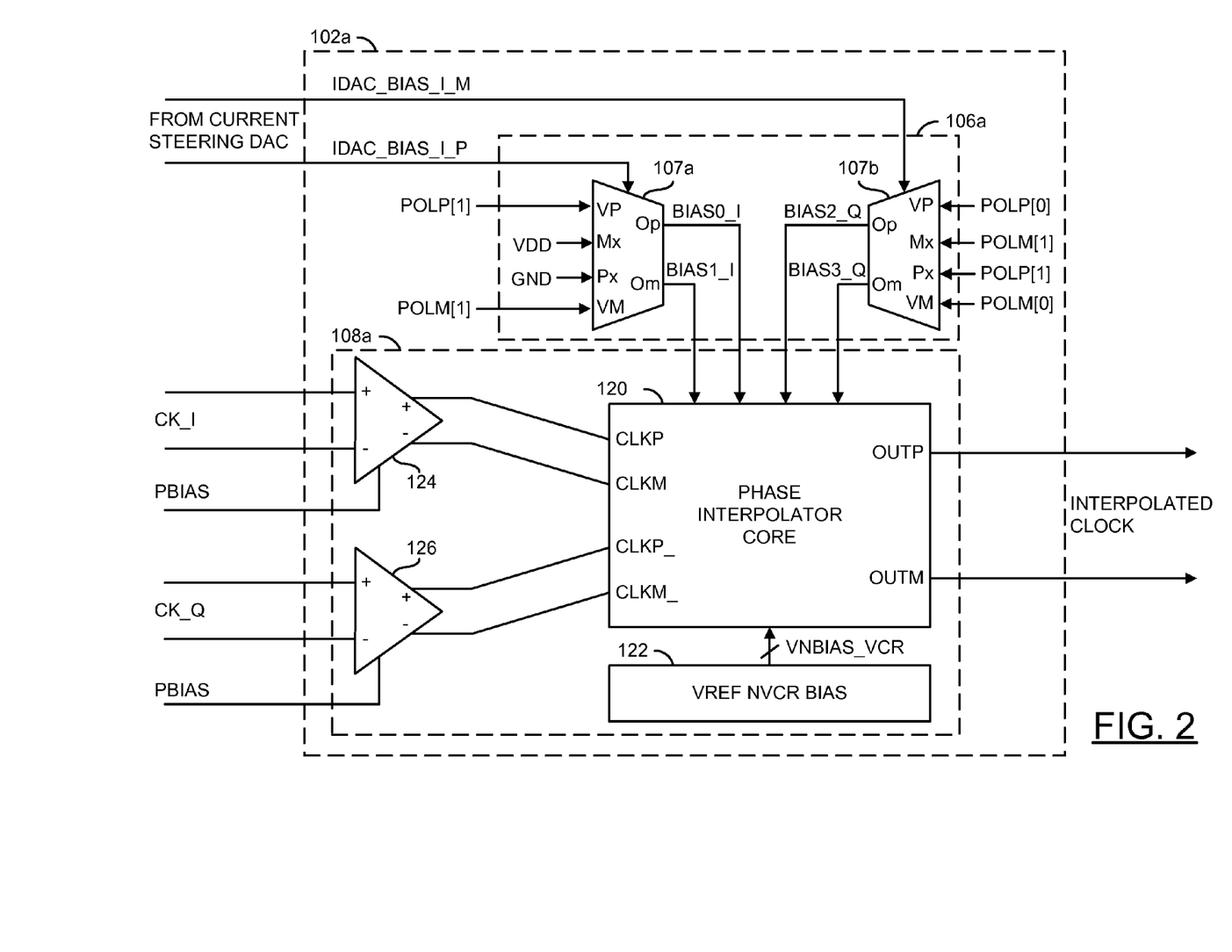
FIG. 2 is a diagram of one of the phase interpolator circuits of FIG. 1.

Referring to FIG. 2, a more detailed diagram of the circuit 102a (or 102b) is shown. The circuit 106a generally comprises a block (or circuit) 107a and a block (or circuit) 107b. The circuits 107a and 107b may be implemented as analog multiplexer circuits. The circuit 107a may receive the signal IDAC_BIAS_I as a signal IDAC_BIAS_I_M (e.g., a first portion) and a signal IDAC_BIAS_I_P (e.g., a second portion). The signal IDAC_BIAS_I_M and a signal IDAC_BIAS_I_P may be first and second portions of an analog control signal.

The multiplexer circuits 107a and 107b may provide bias voltage output signals (e.g., BIAS0_I, BIAS1_I, BIAS2_Q, BIAS3_Q) to the phase interpolator core 120. The multiplexer circuits 107a and 107b may receive inputs (e.g., POLP[1], POLM[1], POLP[0] and POLM[0]) that may be differential digital signals driven by a digital filter. The signals POLP[1:0] and POLM[1:0] may be polarity bits driven from the digital filter. The analog multiplexer circuits 107a and 107b receive the input current signal DAC_NBIAS, which may be directed to either of the outputs BIAS0_I or BIAS1_I (for the multiplexer 107a) or to either of the outputs BIAS2_Q or BIAS3_Q (for the multiplexer 107b), based on the digital signals POLP[1:0] and/or POLM[1:0]. For the polarity multiplexer 106b (shown in FIG. 1), the polarity signals POLP[1:0] and/or POLM[1:0] may be swapped (e.g., POLM[1] may be connected to VP). The particular polarity of the various signals may be varied to meet the design criteria of a particular application.

The circuit 108a generally comprises a block (or circuit) 120, a block (or circuit) 122, a block (or circuit) 124 and a block (or circuit) 126. The circuit 120 may generate an interpolated clock signal (e.g., a signal OUTP and a signal OUTM). The circuit 120 may be implemented as a phase interpolator core circuit (to be described in more detail in connection with FIG. 5). The circuit 122 may be implemented as a bias circuit. The circuit 124 may be implemented as a buffer circuit. The circuit 124 may generate a signal (e.g., VNBIAS_VCR). The circuit 126 may be implemented as a buffer circuit. The circuit 102a and the circuit 102b may generate interpolated clock signals. The circuit 102a generates an I-phase interpolated clock. The circuit 102b generates a Q-phase interpolated clock. In general, the Q-phase interpolated clock leads the I-phase interpolated clock by 90 degrees. The circuits 102a and 102b may each be used to generate differential clocks. For example, the signal OUTP and the signal OUTM may be the differential outputs of the circuit 102a (or 102b). The circuit 102a may be implemented similarly to the circuit 102b, with corresponding circuitry.

Figure 3:
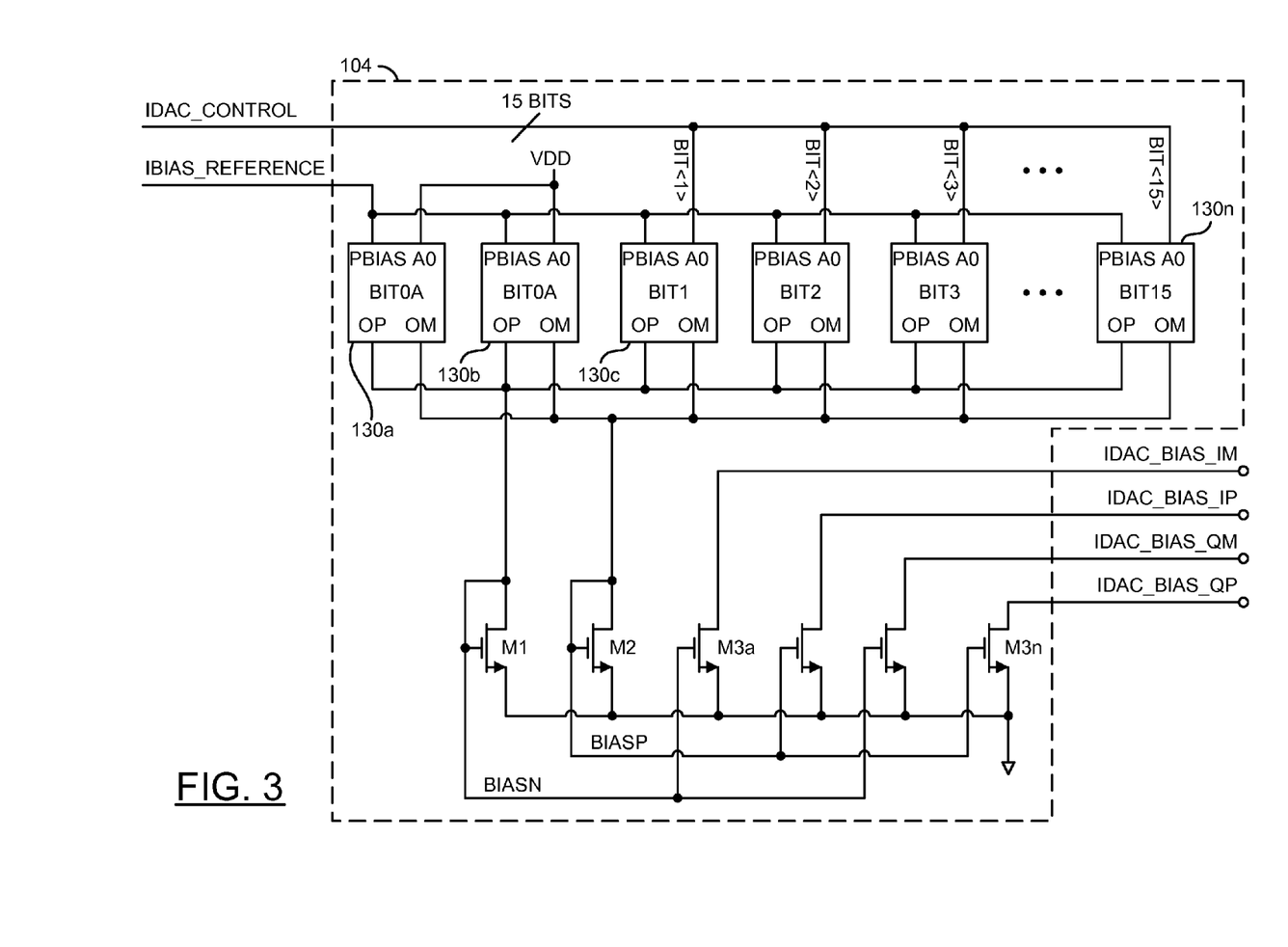
FIG. 3 is a diagram of the current steering DAC of FIG. 1.

Referring to FIG. 3, a more detailed diagram of the current steering DAC circuit 104 is shown. The current DAC circuit 104 generally comprises a number of elements 130a-130n, a transistor M1, a transistor M2 and a number of transistors M3a-M3n. The circuit 104 may be implemented as a 15 bit thermometer DAC. In addition to implementing 15 unit DAC cells, the circuit 104 may implement 2 dummy bits (130a-130b) which are always turned ON. The output currents of the DAC circuit 104 may flow into the transistors M1 and M2 to generate bias currents for blocks 106a and/or 106b. The circuit 106a may receive the analog signals IDAC_BIAS_M and IDAC_BIAS_P. The circuit 106b may receive the analog signals IDAC_BIAS_QM and IDAC_BIAS_QP. The cells 130a and 130b may be dummy cells (e.g., cells that are not controlled by the DAC input signal IDAC_CONTROL and are always ON). The bit 130a generally sends a constant DC current into the transistor M1. The bit 130b generally sends a constant DC current into the transistor M2. The amount of current pumped into the transistors M1 and/or M2 depends on the value of the 15-bit digital signal IDAC_CONTROL. The cells 130a-130n may each have an input (e.g., PBIAS) that may receive the signal IBIAS_REFERENCE. A signal (e.g., BIASP) may be generated when current flows through the transistor M2. Similarly, a signal (e.g., BIASN) may be generated when a current flows through the transistor M1.

Figure 4:
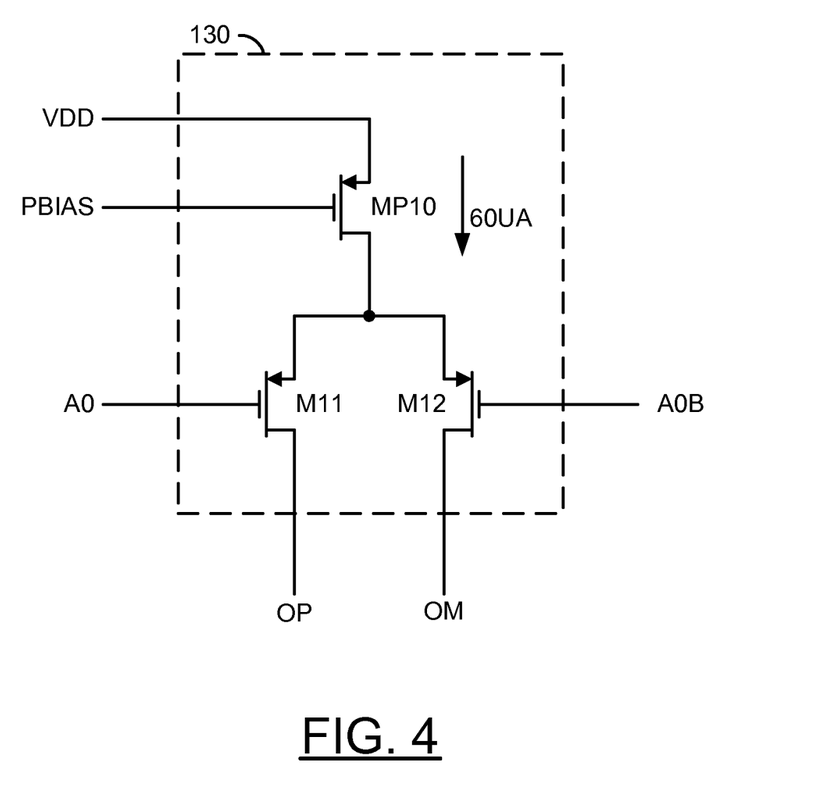
FIG. 4 is a diagram of one of the bits of the circuit of FIG. 3.

Referring to FIG. 4, a more detailed diagram of one of the circuits 130a-130n is shown. The circuit 130 shows a simplified picture of one of the DAC unit cells 130a-130n. The circuit 130 generally comprises a device (e.g., MP10), a device (e.g., M11) and a device (e.g., M12). The device MP10 may be implemented as a P-channel transistor. The devices M11 and M12 may be implemented as N-channel transistors. The bias voltage input PBIAS is generally derived from an external bias generator (e.g., external to block 50). The bias voltage PBIAS may be selected to ensure a current of around 60 uA flowing through the transistor MP10. Depending on the voltage on the input A0 and/or A0B, the current is steered to either the terminal OP or the terminal OM.

Figure 5:
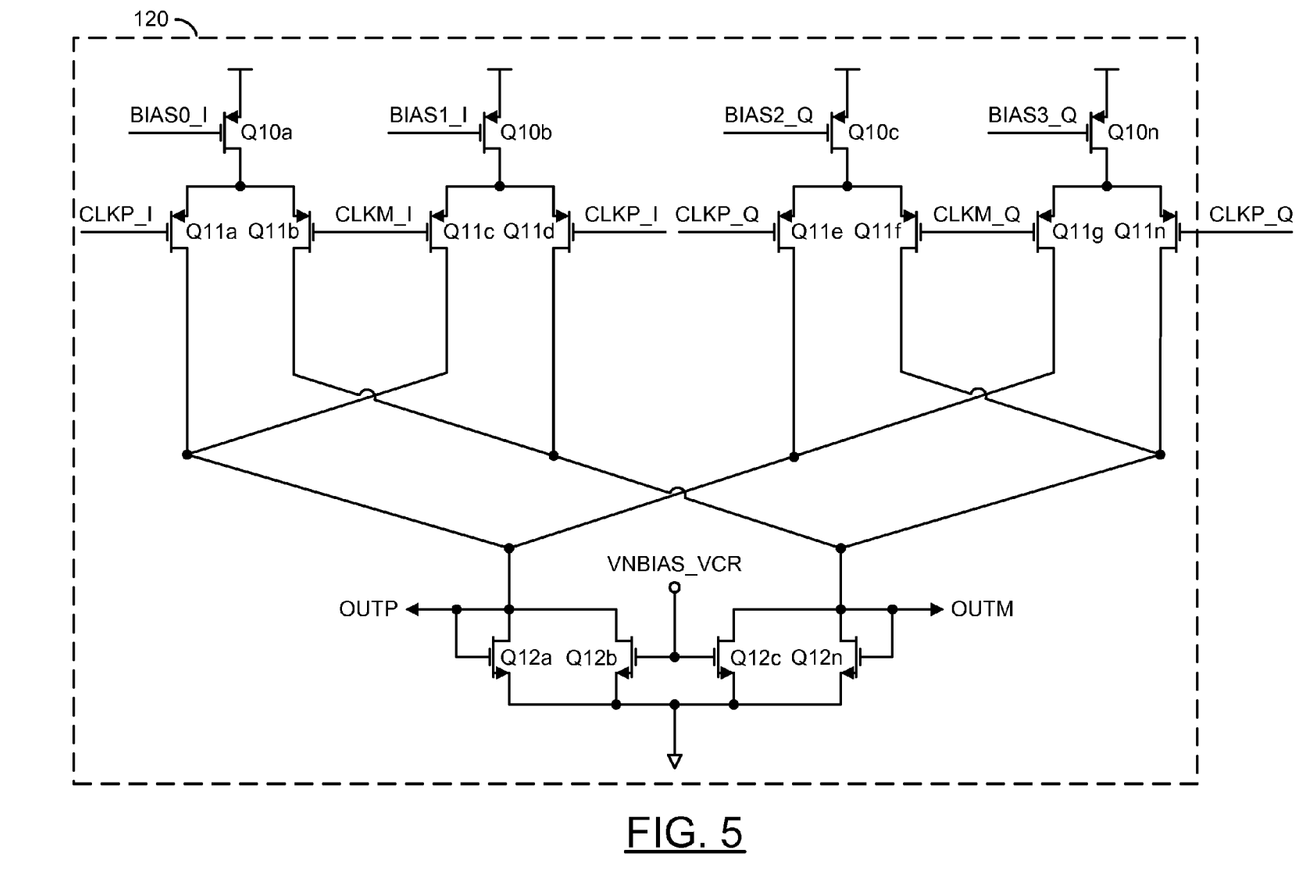
FIG. 5 is a more detailed diagram of the phase interpolator core circuit.

Referring to FIG. 5, a more detailed diagram of the core circuit 120 is shown. The core circuit 120 generally comprises a number of transistors Q10a-Q10n, Q11a-Q11n and Q12a-Q12n. The transistors Q10a-Q10n may receive one of a number of bias signals. For example, the transistor Q10a may receive the signal BIAS0_I, the transistor Q10b may receive the signal BIAS0_I, the transistor Q10c may receive the signal BIAS2_Q, and the transistor Q10n may receive the signal BIAS3_Q. The bias signals BIAS0_I, BIAS0_I, BIAS2_Q, and BIAS3_Q may be received from the circuits 107a and 107b. The transistors Q11a-Q11n may receive a number of clock signals. For example, the transistor Q11a may receive the clock signal CLKP_I. The transistors Q11b and Q11c may receive a clock signal CLKM_I. The transistor Q11d may receive the signal CLKP_I. The transistor Q11e may receive a signal CLKP_Q. The transistors Q11f and Q11g may receive a signal CLKM_Q. The transistor Q11n may receive the signal CLKP_Q. The transistor Q12a may have a gate that may be connected to the signal OUTP. The transistor Q12b and Q12c may have a gate that may receive the signal VNBIAS_VCR. The transistor Q12n may have a gate that may be connected to the signal OUTM. The sources of the transistor Q12a and Q12b may be connected to the drains of the transistors Q11a, Q11c, Q11e and Q11g and to generate the signal OUTP. The sources of the transistors Q12c and Q12n may be connected to the drains of the transistors Q11b, Q11d, Q11f and Q11n to generate the signal OUTM.

The phase interpolator 100 may be used to meet various headroom requirements. The current DAC 104 and the polarity circuits 106a and/or 106b may be implemented as a single PMOS device. The current DAC 104 and/or the polarity logic circuits 108a and/or 108b may be implemented as separate stages.

Figure 6:
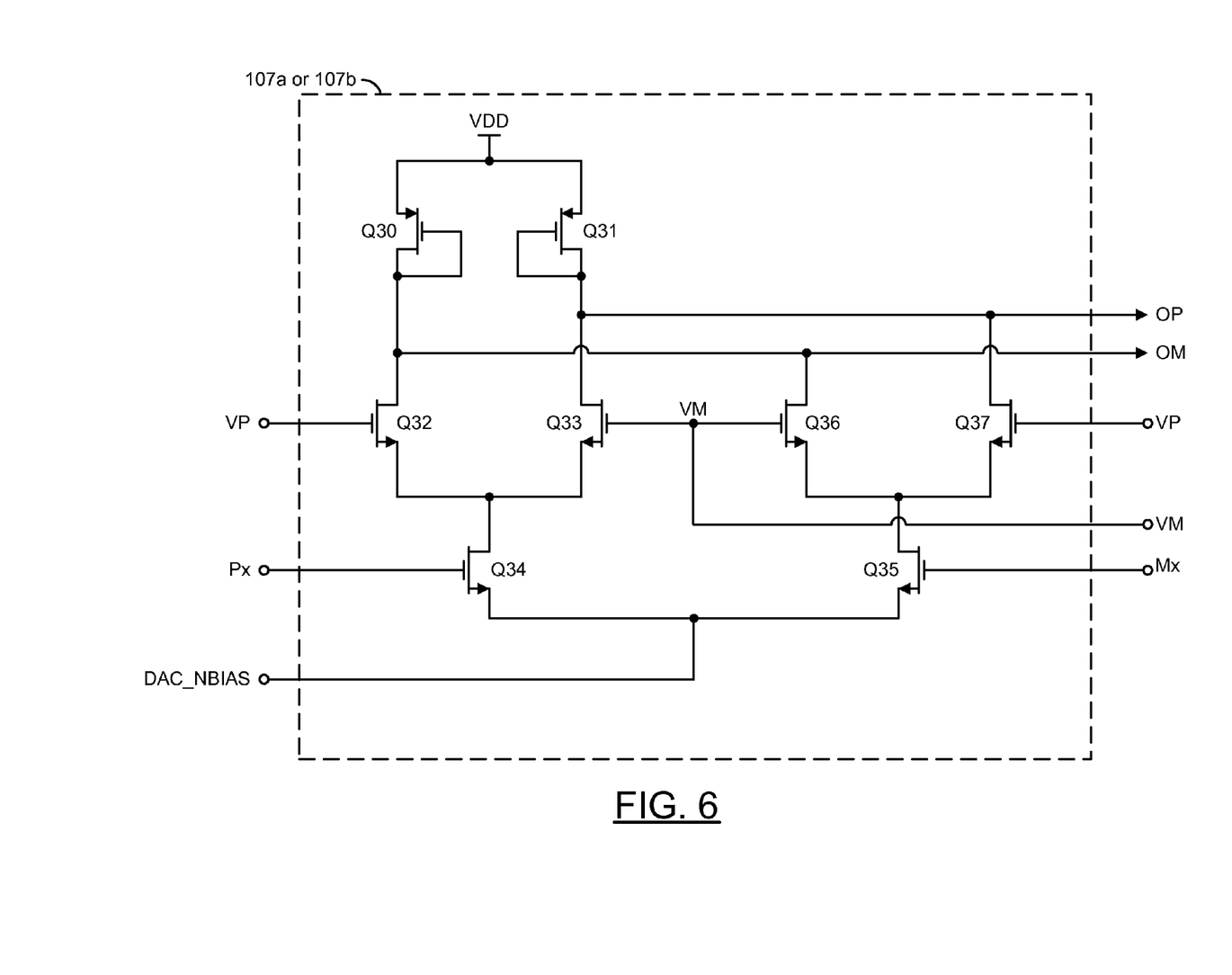
FIG. 6 is a more detailed diagram of the select circuits of FIG. 2.

Referring to FIG. 6, a more detailed diagram of one of the select circuits 107a (or 107b) is shown. The circuit 107 is shown comprising a number of transistors Q30-Q37. The signal DAC_NBIAS may be generated from the current DAC circuit 102. The circuits 107a (or 107b) may be implemented without RC filters typically used to slew clock signals (e.g., increasing rise/fall time of the input and output waveforms may be eliminated (or minimized)). The circuit 100 may implement a voltage controlled resistor (VCR) with the help of the bias voltage signal DAC_NBIAS. The value of bias voltage signal DAC_NBIAS may be a function of the frequency of the input clock signals.

The circuit 107a (or 107b) may be implemented as an analog multiplexer. The circuit 107a may allow the current DAC_NBIAS to flow through either the transistor Q30 or the transistor Q31 based on the digital signals VP, VM, Px and/or Py. The signals VP and VM may be differential signals (e.g., when VP is "HIGH (or VDD)" then VM=0V). Similarly the signals Px and Mx may be implemented as differential signals.

The transistors Q32, Q33, Q34, Q38, Q36, and/or Q37 may be implemented as switches that turn on when the gate input is VDD and turn off when gate input is 0V. The transistors Q30 and/or Q31 may be implemented as diode connected transistors that may generate a voltage when current flows through them. The transistors Q30 and/or Q31 supply voltage to the phase interpolator core 120. When no current flows through the transistors Q30 and/or Q31 then the outputs are pulled up to VDD. For example:

$$OP = DAC\_NBIAS * [Px*VP + Mx*VM]$$

$$OM = NOT(OP) = DAC\_NBIAS * [Px*VM + Mx*VP]$$

Figure 7:
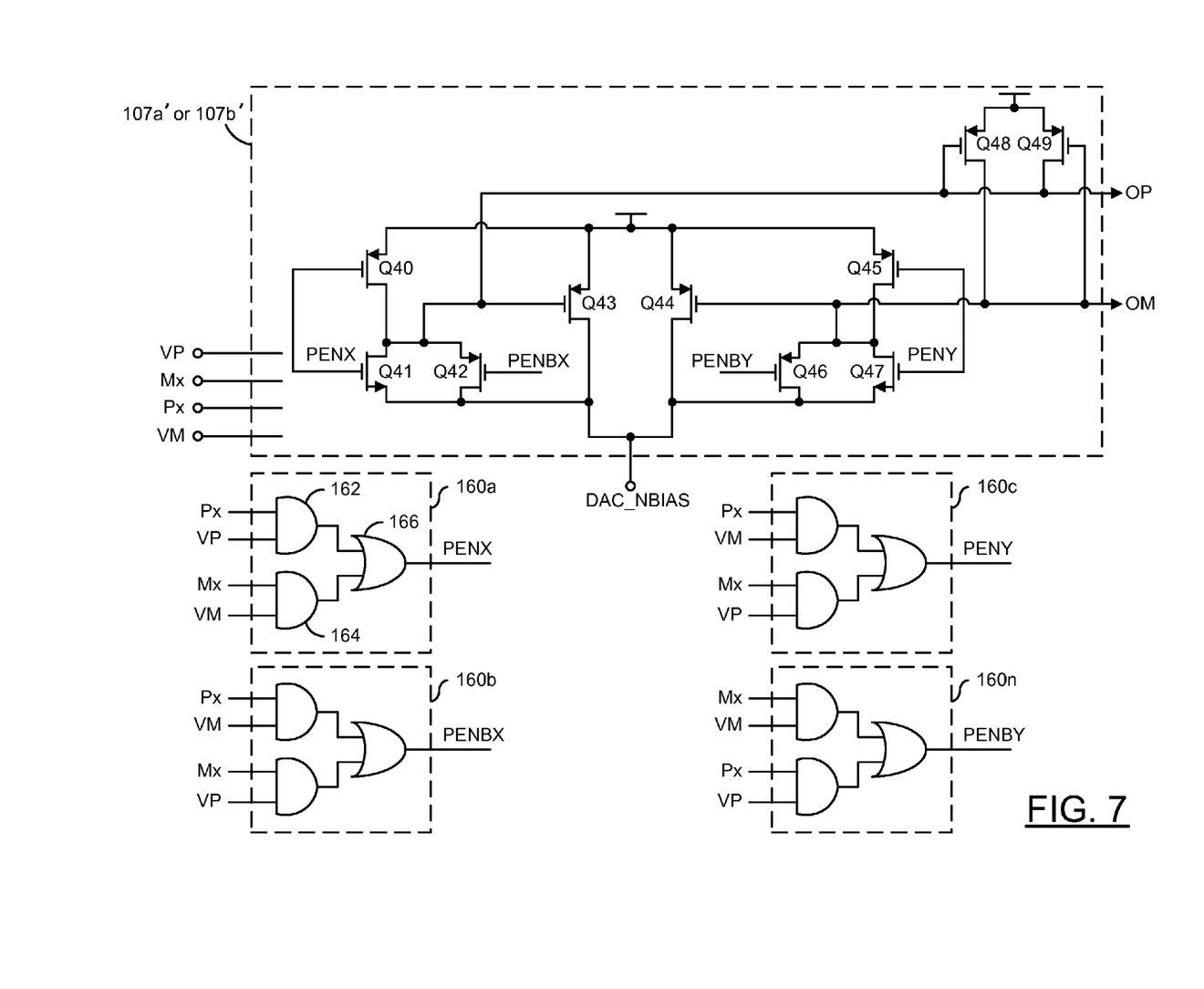
FIG. 7 is an alternate diagram of the select circuits of FIG. 2.

Referring to FIG. 7, an alternate diagram of the circuit 107a' (or 107b') is shown. The circuit 107a' generally comprises a number of transistors Q40-Q49. The transistors Q41 and Q42 may receive a control signal PENX and a control signal PENBX. Similarly, the transistors Q46 and Q47 may receive control signals PENBY and PENY. The circuits 160a-160n show details of how the enable signals PENX, PENBX, PENY and PENBY are generated in response to the signals Px, VP, Mx and VM. In general, each of the circuits 160a-160n may be implemented as a gate 162, a gate 164 and a gate 166. However, the particular implementation of the gates 162, 164 and 166 may be varied to meet the design criteria of a particular implementation.

The transistors Q40 and Q45 may be sized to be weak compared to the transistors Q51 and Q52 (to be described in more detail in connection with FIG. 3). For example, the transistor Q40 may be sized to be equal to the transistor Q45 in terms of width (W) and length (L). The transistor Q51 may be sized to be equal to the transistor Q52 in terms of W and L. The circuit 107 may operate as an analog multiplexer to multiplex the analog signals. The signal IDAC_NBIAS (e.g., implemented as a current) is generally either directed to the transistor Q43 or to the transistor Q44. The digital signals Vp, Px, Mx may determine whether the current signal IDAC_N-BIAS is directed to the transistor Q43 or to the transistor Q44.

If the current is directed to the transistor Q43, then the gate of the transistor Q44 is normally pulled to VDD by the transistor Q45 and/or the transistor Q51. When the current needs to be directed to the transistor Q44, the gate of the transistor Q43 is pulled to VDD around the same time the signal OM settles to a final value. If the gate of the transistor Q43 is pulled up to VDD instantaneously, then for a short interval both the transistor Q44 and the transistor Q43 gates are pulled to VDD. Both the signal OP and the signal OM are at VDD which can cause undesirable operation. To avoid this, the transistor Q40 and the transistor Q45 are made very weak to pull up to VDD slowly. To aid this pull up to VDD, the transistors Q51 and/or Q52 may be added. The transistor Q51 and the transistor Q52 may be made large relative to the transistor Q40 and the transistor Q45. The transistors Q48 and/or Q49 may be implemented to pull up the node OM (and/or the node OP). If the current DAC_NBIAS is directed to the transistor Q43 (based on the input signals VP, VM, PX, and/or Mx), then the transistor Q44 is turned off and the gate of the transistor Q44 (e.g., output OM) is pulled up to VDD slowly by the transistor Q45. This pull up may be enhanced by the transistor Q48 (as it is turned ON) whose gate is driven by the signal OP which is at a voltage lower than VDD.

Figure 8:
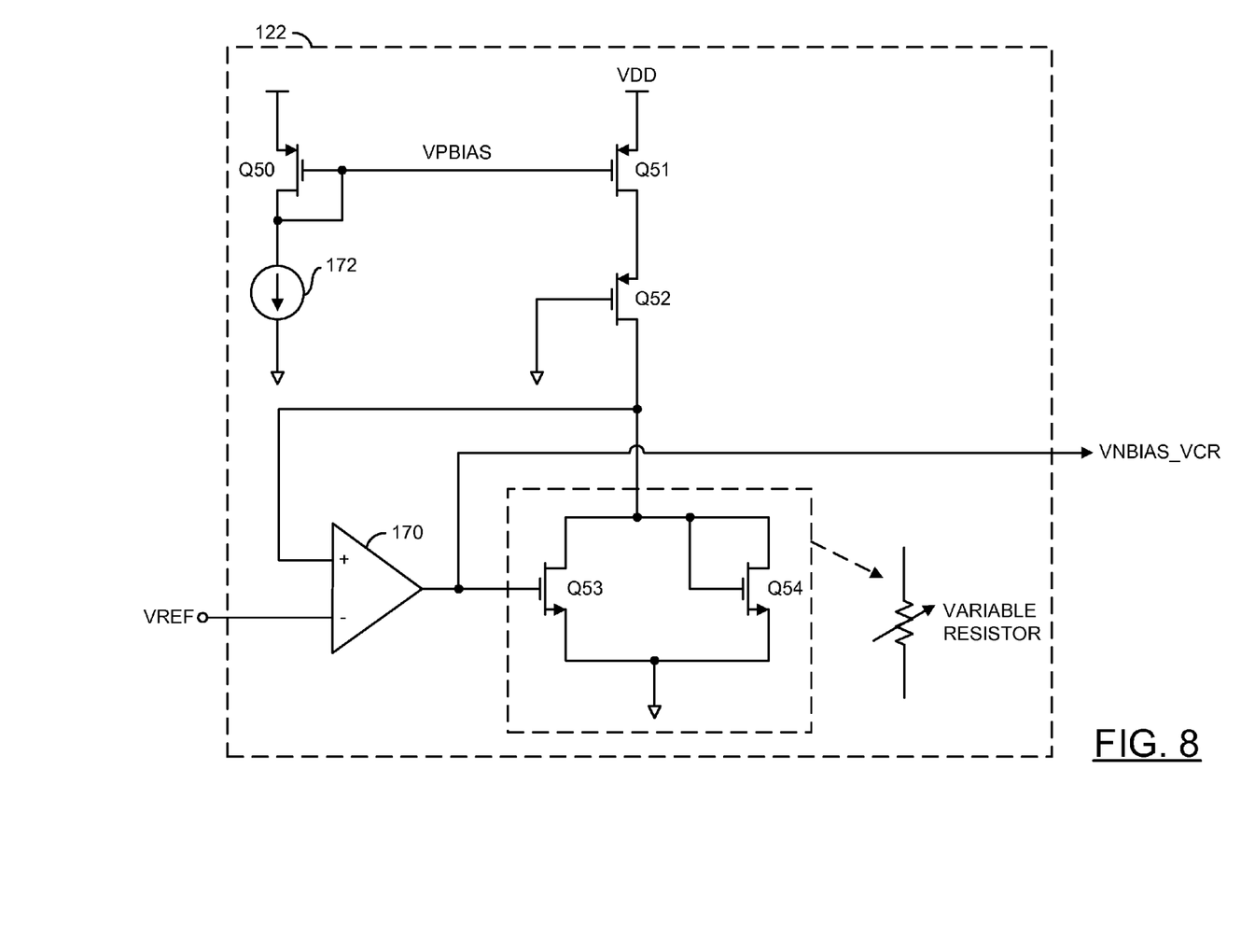
FIG. 8 is a diagram of the bias circuit of FIG. 2.

Referring to FIG. 8, a more detailed diagram of the circuit 122 is shown. The circuit 122 may be used to generate the signal VNBIAS_VCR. The circuit 122 generally comprises a number of transistors Q50-Q54, a device 170 and a current source 172. The bias voltage VNBIAS_VCR may be supplied to the phase interpolator 120 and/or to the clock buffers 124 and/or 126 to regulate resistance. The voltage VREF may be derived from a bias generator. The voltage VREF may be programmable. The resistance between the node "VP" to ground is normally a function of the voltage VREF.

Figure 9:
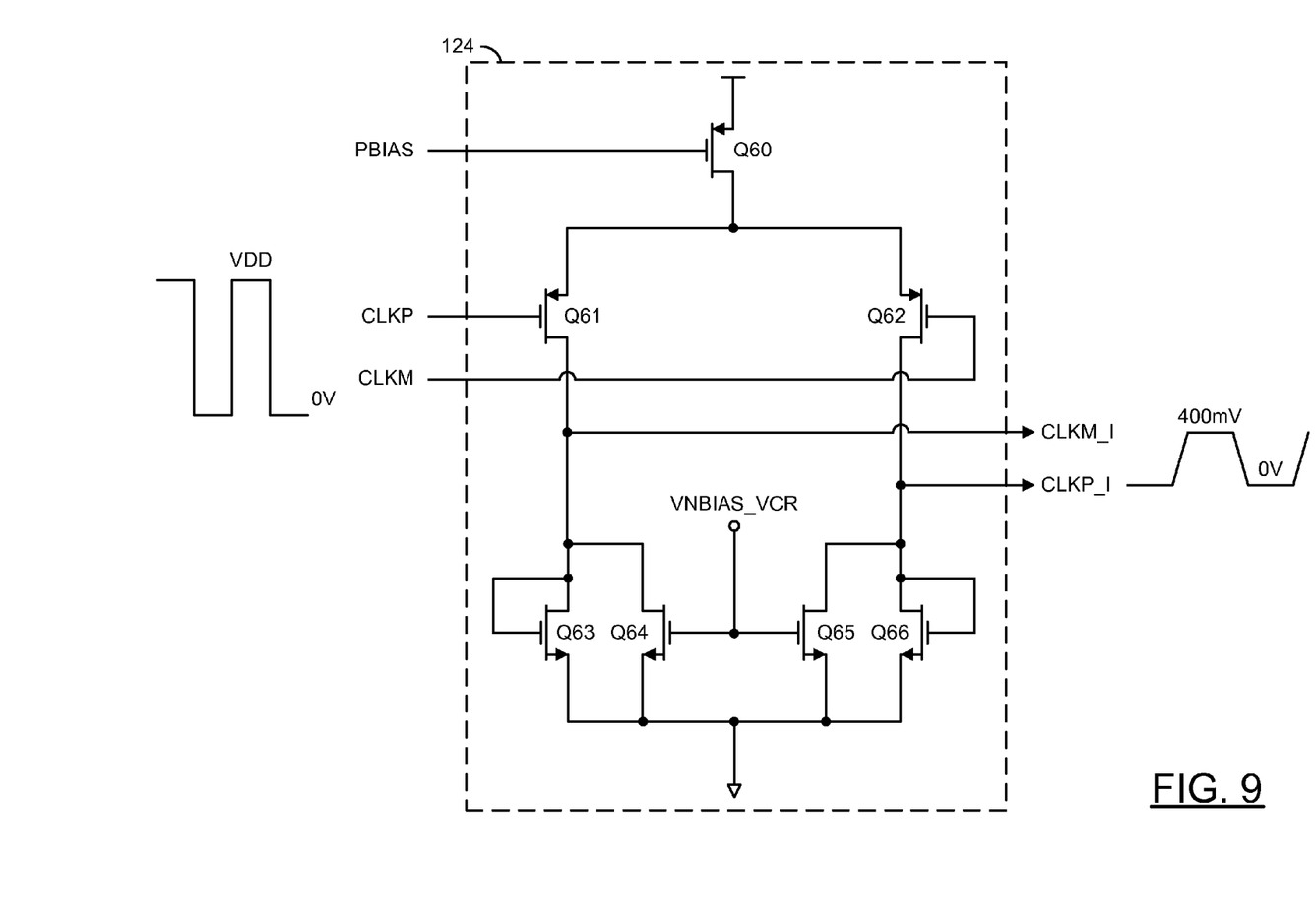
FIG. 9 is a diagram of a buffer.

Referring to FIG. 9, a more detailed diagram of the circuit 124 is shown. The circuit 124 is shown implemented with a number of transistors Q60-Q66. The circuit 124 may implement a CML buffer. The circuit 124 may convert rail to rail clock differential signals (e.g., CLKP and CLKM) at the input driving the gates of the transistors Q61 and Q62 to a differential low swing output (e.g., CLKM_I and CLKP_I). The transistors Q61 and Q62 may steer the DC current provided by the transistor Q60 into the load transistor pairs (Q63 and Q64; Q65 and Q66). The load transistors Q63 and Q64 (and Q65 and Q66) work as a voltage controlled resistor. The input voltage VNBIAS_VCR may be used to set the resistance value of the load transistors. The nominal value of resistance may be targeted to be around 400 ohm for a 3 GHz operation. The circuit 124 may provide a low swing signal to drive the phase interpolator core 120.

The circuit 100 illustrates an example implementation of an analog phase interpolator that may operate at low supply voltage. The phase interpolator implementation of the circuit 100 may use less area than conventional approaches. In one example, the phase interpolator circuit 100 may be implemented as part of a Clock Data Recovery (CDR) loop. The output from the interpolator 100 may be used to sample (or latch) incoming data. A Phase Interpolator (PI) normally needs an I-phase clock and a Q-phase clock (e.g., two clock signals which are separated in phase by 90 degrees). The equations below describe the operating principles of a phase interpolator.

$$CK\_I = \sin wt$$

$$CK\_Q = \sin\left(wt - \frac{Pi}{2}\right) = -\cos wt$$

$$Y = \sin(wt - \varphi) 0 \leq \varphi \leq \frac{Pi}{2}$$

Y=sin wt×cos φ−cos wt×sin φ
a=cos φ
b=sin φ
a+b=1 ⇒ linear weighting (this is the chosen method)
a & B are weighting coefficients By changing the sign of the "a" and "b" coefficients, a 4 quadrant interpolation may be implemented. Rise/fall time control normally depends on the clock frequency. The rise time/fall time of the output of the phase interpolator 100 is normally much larger than the delay between the two input clocks (e.g., ΔT). In this case if the rise/fall time=Tr, then: Tr>2*ΔT.

Rise time/fall time of the input clocks (e.g., presented to the phase interpolator) should normally be larger than the propagation delay of the phase interpolator (Tdelay), where $$Tr > 2*Tdelay.$$

For example, if Fclk=3 GHz, the two clocks in phase and Quadrature are separated by ΔT=83.25 ps; where Tr>166 ps for Fclk=1 GHz; ΔT=250 ps; where Tr>500 ps.

The circuit 100 may have a voltage headroom limitation that may limit the lowest usable supply voltage. The polarity bits may be used to control the "sign" of the coefficients (e.g., to control in which quadrant interpolation will be done). To ensure operation at low supply voltages, the polarity function and/or the current DAC functions may be combined. Such a combination may reduce transistor stackup.

The circuit 100 may operate as follows. The bias block 122 may generate the signal IDAC_BIAS to supply a bias to the phase interpolator core 120n and/or to the CML buffer loads 124 and/or 126. The current DAC may provide bias voltages to the phase interpolator blocks 108a and/or 108b through the analog multiplexer blocks 106a and/or 106b. The polarity signals may be used to determine the quadrant of the output clock generated by the Phase interpolator 100. The CML buffers 124 and/or 126 receive 2 sets of rail to rail (CMOS levels) differential clocks. The buffers 124 and/or 126 present output signals to drive the phase interpolator block 120. The phase interpolator 120 will interpolate between the inphase and quadrature clock signals arriving from the CML buffer.

Figure 10:
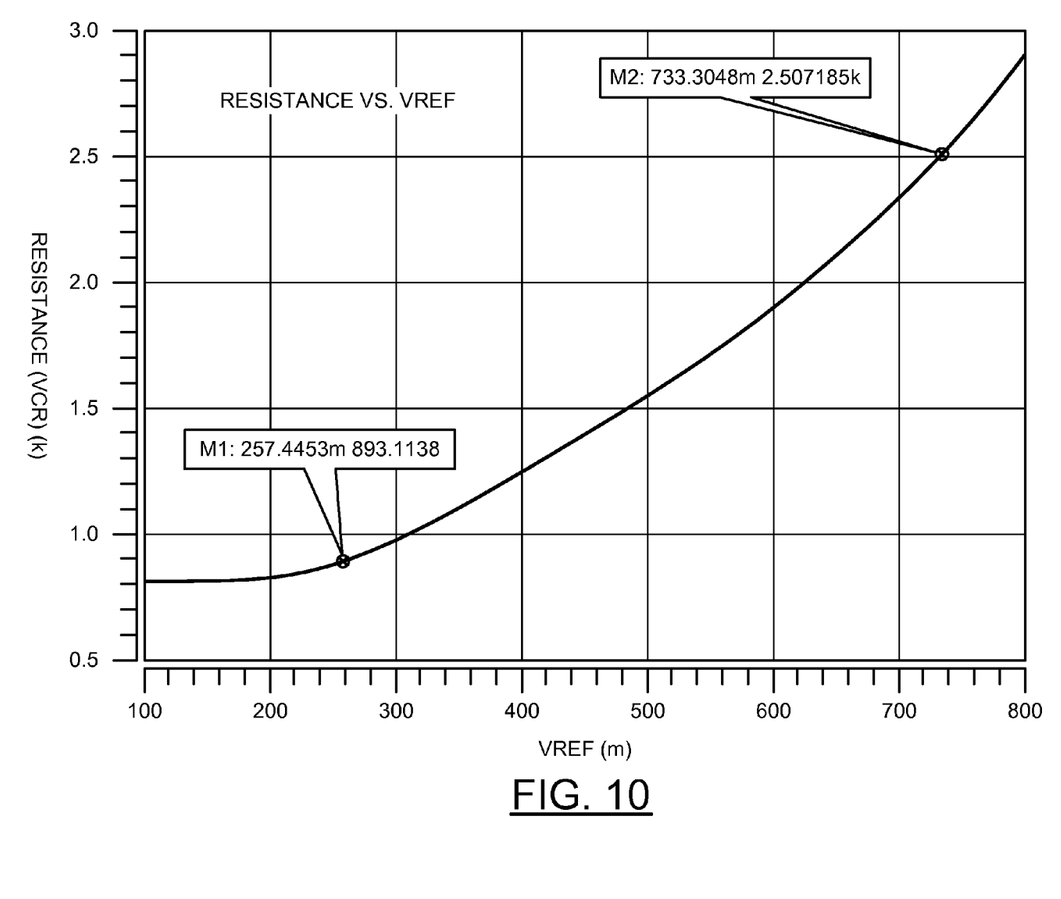
FIG. 10 is a plot of resistance versus VREF.

Referring to FIG. 10, a plot of the Resistance versus VREF is shown. Varying the reference VREF may change the resistance by a factor of 2.

Figure 11:
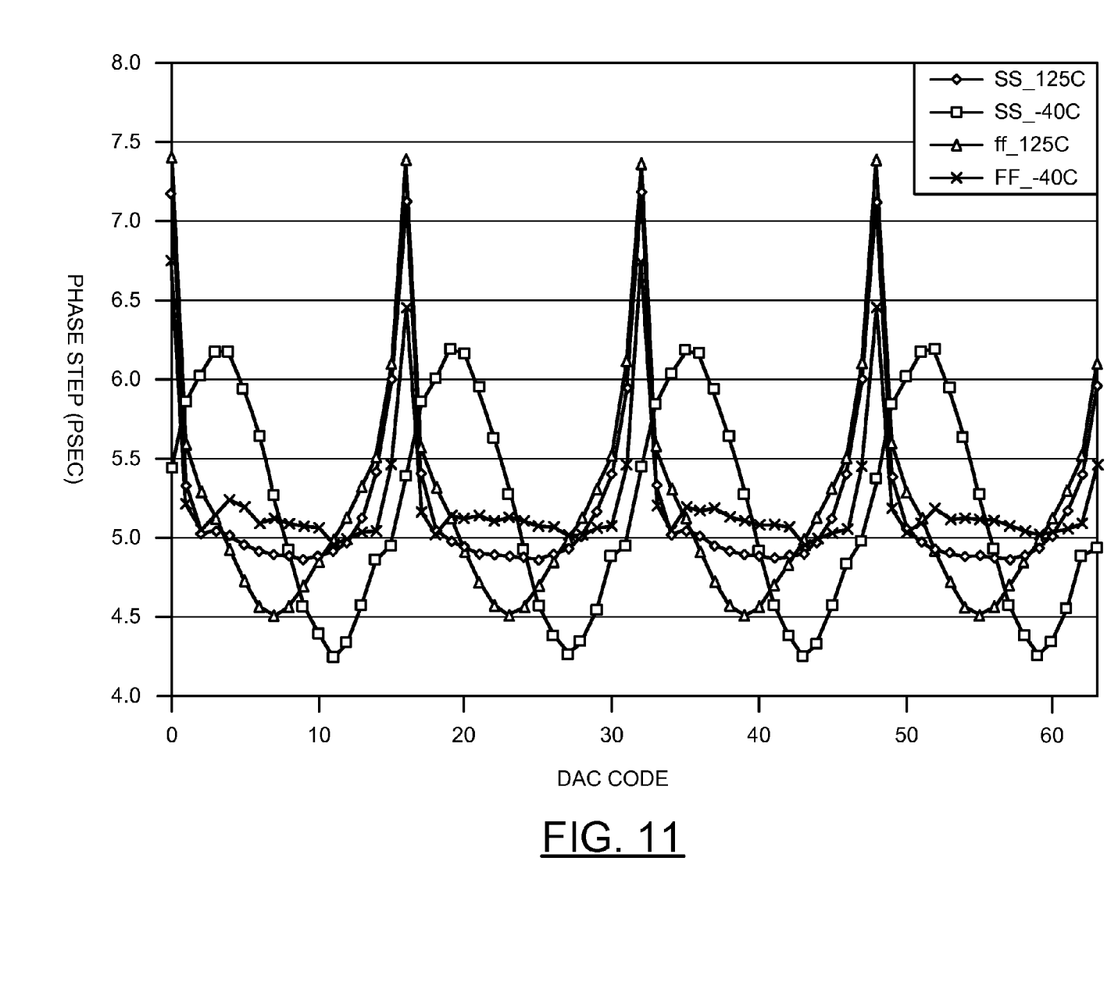
FIG. 11 is a plot of the step size of the phase interpolator versus DAC code.

Referring to FIG. 11, a simulation of the phase interpolator step versus DAC code over process skew corner and temperature is shown.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first phase circuit configured to generate a first portion of a phase interpolated clock signal in response to (i) a control signal, and (ii) a first bias signal;
a second phase circuit configured to generate a second portion of said phase interpolated clock signal in response to (i) said control signal, and (ii) a second bias signal, wherein said first phase circuit and said second phase circuit each receive a feedback of said first portion and said second portion of said phase interpolated clock signal; and
a current steering circuit configured to generate said first bias signal and said second bias signal in response to a reference bias signal, wherein said reference bias signal is generated using a variable resistor.

2. The apparatus according to claim 1, wherein said current steering circuit is configured to generate said first bias signal and said second bias signal in further response to a second control signal.

3. The apparatus according to claim 2, wherein said second control signal comprises a multi-bit control signal.

4. The circuit according to claim 3, wherein said current steering circuit comprises a digital-to-analog converter circuit having a plurality of elements each configured to respond to one of said bits of said second control signal.

5. The apparatus according to claim 1, wherein said first phase circuit further comprises:
a first multiplexer circuit configured to generate a first plurality of bias signals in response to said control signal and said first bias signal; and
a first phase interpolator circuit configured to generate said first portion of said interpolated clock signal in response to said first plurality of bias signals and said feedback of said phase interpolated clock signal.

6. The apparatus according to claim 5, wherein said second phase circuit further comprises:
a second multiplexer circuit configured to generate a second plurality of bias signals in response to the control signal and said second bias signal; and
a second phase interpolator circuit configured to generate said second portion of said interpolated clock signal in response to said second plurality of bias signals and said feedback of said phase interpolated clock signal.

7. The apparatus according to claim 1, wherein said phase interpolated clock signal comprises an I-phase interpolated clock signal and a Q-phase interpolated clock signal.

8. The apparatus according to claim 1, wherein said first and second phase circuits are analog components.

9. The apparatus according to claim 1, wherein said apparatus is used in a clock data recovery (CDR) circuit.

10. The apparatus according to claim 1, wherein said variable resistor allows said apparatus to minimize a supply voltage used to power said apparatus.

11. A method for implementing a phase interpolator, comprising:
(A) generating a first portion of a phase interpolated clock signal in response to (i) a control signal, and (ii) a first bias signal;
(B) generating a second portion of said phase interpolated clock signal in response to (i) said control signal, and (ii) a second bias signal, wherein said step for generating said first portion of said phase interpolated clock signal and said step for generating said second portion of said phase interpolated clock signal each receive a feedback of said first portion and said second portion of said phase interpolated clock signal; and
(C) generating said first bias signal and said second bias signal in response to a reference bias signal, wherein said reference bias signal is generated using a variable resistor.

\* \* \* \* \*